（12）United States Patent
Kang et al.

(10) Patent No.: US 11,660,979 B2
(45) Date of Patent: May 30, 2023

(54) SYSTEM AND METHOD FOR ESTIMATING STATE OF CHARGE OF A LITHIUM BATTERY CELL OF A VEHICLE

(71) Applicant: GM Global Technology Operations LLC, Detroit, MI (US)

(72) Inventors: Jun-mo Kang, Ann Arbor, MI (US); Insu Chang, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 390 days.

(21) Appl. No.: 17/142,459

(22) Filed: Jan. 6, 2021

(65) Prior Publication Data
US 2022/0212565 A1 Jul. 7, 2022

(51) Int. Cl.
*H01M 4/02* (2006.01)
*B60L 58/21* (2019.01)
*G01R 31/367* (2019.01)
*G01R 31/387* (2019.01)

(52) U.S. Cl.
CPC ............ *B60L 58/21* (2019.02); *G01R 31/367* (2019.01); *G01R 31/387* (2019.01); *B60L 2250/16* (2013.01)

(58) Field of Classification Search
None
See application file for complete search history.

(56) References Cited

FOREIGN PATENT DOCUMENTS

CN 111177924 * 12/2019

\* cited by examiner

*Primary Examiner* — Jacob B Marks
(74) *Attorney, Agent, or Firm* — Vivacqua Crane PLLC

(57) ABSTRACT

A method and system for estimating state of charge of a lithium battery cell of a vehicle is provided. The method comprises providing a non-linear function of the lithium battery cell, a normalized lithium surface density and an actual voltage at a current of the lithium battery cell having an internal resistance. The method further comprises determining an actual lithium surface density based on the actual voltage relative to an inverse of the non-linear function. The method further comprises determining a varying parameter based on the actual lithium surface density relative to a first diffusion model. The method further comprises determining a predicted lithium surface density based on the varying parameter relative to a second diffusion model. The method further comprises determining an estimated state of charge of the lithium battery cell when a difference between the predicted and actual lithium surface densities is less than a first threshold.

20 Claims, 2 Drawing Sheets

SYSTEM AND METHOD FOR ESTIMATING STATE OF CHARGE OF A LITHIUM BATTERY CELL OF A VEHICLE

INTRODUCTION

The present disclosure relates lithium batteries and, more particularly, systems and methods of estimating state of charge of lithium batteries for vehicles.

In the automotive industry, it has been challenging to estimate state of charge of a lithium battery cell of a vehicle. For example, Some state of charge estimations are not as reliable as desired. Moreover, relatively significant calibration effort is required for existing systems and methods.

SUMMARY

Thus, while current state of charge estimations achieve their intended purpose, there is a need for a new and improved system and method for estimating state of charge of lithium batteries for vehicles.

One aspect of the present disclosure includes a method for estimating state of charge of a lithium battery cell of a vehicle. The method comprises providing a non-linear function of the lithium battery cell, a normalized lithium surface density and an actual voltage at a current of the lithium battery cell having an internal resistance. The non-linear function may be represented as $$V - R_{ohmic}I = f\left(\frac{c_s^+}{c_{s,max}^+}\right)$$

where V is the actual voltage, $$\frac{c_s^+}{c_{s,max}^+}$$

is the normalized lithium surface density, I is the current, $R_{ohmic}$ is the internal resistance of the battery cell. In this example, the method further comprises determining an actual lithium surface density based on the actual voltage relative to an inverse of the non-linear function represented as $$\frac{c_s^+}{c_{s,max}^+} = f^{-1}(V - R_{ohmic}I).$$

In this aspect, the method further comprises determining a varying parameter based on the actual lithium surface density relative to a first diffusion model. The first diffusion model may be represented as $$\frac{c_s^+(k)}{c_s^{+max}} - \frac{c_s^+(0)}{c_s^{+max}} + h\Delta t \sum_{n=1}^{k} I(n) = -I(k)b_0$$

where $b_0$ is the varying parameter dependent on temperature and aging, k is a discrete-time index, h is a known constant, $\Delta t$ is a time difference between discrete-time indices, $I(k)$ is a measured current at k time index, and n is a summation variable.

In this aspect of the present disclosure, the method further comprises determining a predicted lithium surface density and an estimated state of charge based on the varying parameter relative to a second diffusion model. The second diffusion model may be represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k).$$

where $\frac{c_s^+}{c_{s,max}^+}$ is the normalized lithium surface density and $SoC^+$ is the estimated state of charge.

In this aspect, the method further comprises determining an estimated state of charge of the lithium battery cell when a difference between the predicted and actual lithium surface densities is less than a first threshold.

In another example of this aspect, the step of determining the estimated state of charge of the lithium battery cell comprises comparing the predicted lithium surface density with the actual lithium surface density in real time. Moreover, the step of determining the estimated state of charge of the lithium battery cell further comprises correcting the predicted lithium surface density in real time if a difference between the predicted and actual lithium surface densities is greater than a second threshold.

In yet another example, the step of determining the actual lithium surface density comprises applying the actual voltage to the inverse of the non-linear function.

In still another example, the step of determining the varying parameter comprises applying the actual lithium surface density to the first diffusion model of the lithium battery cell.

In yet another example of this aspect, the step of determining the predicted lithium surface density and the estimated state of charge comprises applying the varying parameter to the second diffusion model of the lithium battery cell.

In another example of this aspect, the method further comprises transmitting a signal of the estimated state of charge to a receiver having a display in the vehicle and displaying the estimated state of charge based on the signal.

Another aspect of the present disclosure, a method for estimating state of charge of a lithium battery cell of a vehicle is provided. The method comprises providing a non-linear function of the lithium battery cell, a normalized lithium surface density and an actual voltage at a current of the lithium battery cell having an internal resistance. The non-linear function may be represented as $$V - R_{ohmic}I = f\left(\frac{c_s^+}{c_{s,max}^+}\right),$$

where V is the actual voltage, $$\frac{c_S^+}{c_{s,max}^+}$$

is the normalized lithium surface density, I is the current, and $R_{ohmic}$ is the internal resistance of the battery cell. In this aspect, the method further comprises determining an actual lithium surface density based on the actual voltage relative to an inverse of the non-linear function which may be represented as $$\frac{c_s^+}{c_{s,max}^+} = f^{-1}(V - R_{ohmic}I).$$

Moreover, the method further comprises determining a varying parameter based on the actual lithium surface density relative to a first diffusion model which may be represented as $$\frac{c_s^+(k)}{c_s^{+max}} - \frac{c_s^+(0)}{c_s^{+max}} + h\Delta t \sum_{n=1}^{k} 1(n) = -I(k)b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable.

In this aspect, the method further comprises determining a predicted lithium surface density and estimated state of charge based on the varying parameter relative to a second diffusion model which may be represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k).$$

where $\frac{c_s^+}{c_{s,max}^+}$ is the normalized lithium surface density and $SoC^+$ is the s, max estimated state of charge.

Moreover, the method further comprises determining an estimated state of charge of the lithium battery cell when a difference between the predicted and actual lithium surface densities is less than a first threshold. Furthermore, the method comprises displaying the estimated state of charge of the lithium battery cell in the vehicle to monitor battery cell state of charge.

In one example of this aspect, the step of determining the estimated state of charge of the lithium battery cell comprises comparing the predicted lithium surface density with the actual lithium surface density in real time.

In another example, the step of determining the estimated state of charge of the lithium battery cell comprises correcting the predicted lithium surface density in real time if a difference between the predicted and actual lithium surface densities is greater than a second threshold.

In another example, the step of determining the actual lithium surface density comprises applying the actual voltage to the inverse of the non-linear function.

In yet another example of this aspect, the step of determining the varying parameter comprises applying the actual lithium surface density to the first diffusion model of the lithium battery cell.

In still another example, the step of determining the predicted lithium surface density and the estimated state of charge comprises applying the varying parameter to the second diffusion model of the lithium battery cell.

In another example, the step of displaying comprises transmitting a signal of the estimated state of charge to a receiver having a display in the vehicle and displaying the estimated state of charge based on the signal.

In another aspect of the present disclosure, a system for estimating state of charge of a lithium battery cell of a vehicle is provided. The system comprises a display disposed in the vehicle for indicating the estimated state of charge of the lithium battery cell. The system further comprises a control unit disposed in the vehicle. In this aspect, the control unit is connected to the battery cell and the display. The electronic control unit is programmed to include or store a non-linear function of the lithium battery cell, a normalized lithium surface density and an actual voltage at a current of the lithium battery cell having an internal resistance. The non-linear function may be represented as $$V - R_{ohmic}I = f\left(\frac{c_s^+}{c_{s,max}^+}\right),$$

where V is the actual voltage, $$\frac{c_S^+}{c_{s,max}^+}$$

is the normalized lithium surface density, I is the current, $R_{ohmic}$ is the internal resistance of the battery cell. The control unit is programmed to determine an actual lithium surface density based on the actual voltage relative to an inverse of the non-linear function represented as $$\frac{c_s^+}{c_{s,max}^+} = f^{-1}(V - R_{ohmic}I).$$

In this example, the control unit is programmed to determine a varying parameter based on the actual lithium surface density relative to a first diffusion model represented as $$\frac{c_s^+(k)}{c_s^{+max}} - \frac{c_s^+(0)}{c_s^{+max}} + h\Delta t \sum_{n=1}^{k} 1(n) = -I(k)b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable.

Also in this example, the control unit is programmed to determine a predicted lithium surface density and an estimated state of charge based on the varying parameter relative to a second diffusion model. The second diffusion model may be represented as $$x(k+1) = x(k) - I(k) \text{ and}$$

-continued $$\begin{bmatrix} c_s^+(k) \\ c_s^{+max} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k)$$

where $\dfrac{c_s^+}{c_{s,max}^+}$ is the normalized lithium surface density and SoC⁺ is the s, max estimated state of charge. In this example of this aspect, the control unit is programmed to determine an estimated state of charge of the lithium battery cell when a difference between the predicted and actual lithium surface densities is less than a first threshold.

Moreover, the control unit is programmed to transmit a signal of the estimated state of charge of the lithium battery cell to the display in the vehicle. Additionally, the display is configured to indicate the estimated state of charge based on the signal.

In one example of this aspect, the step of determining the estimated state of charge of the lithium battery cell comprises comparing the predicted lithium surface density with the actual lithium surface density in real time.

In another example, the step of determining the estimated state of charge of the lithium battery cell comprises correcting the predicted lithium surface density in real time if a difference between the predicted and actual lithium surface densities is greater than a second threshold.

In yet another example, the step of determining the actual lithium surface density comprises applying the actual voltage to the inverse of the non-linear function.

In still another example of this aspect, the step of determining the varying parameter comprises applying the actual lithium surface density to the first diffusion model of the lithium battery cell.

In another example, the step of determining the predicted lithium surface density and the estimated state of charge comprises applying the varying parameter to the second diffusion model of the lithium battery cell.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
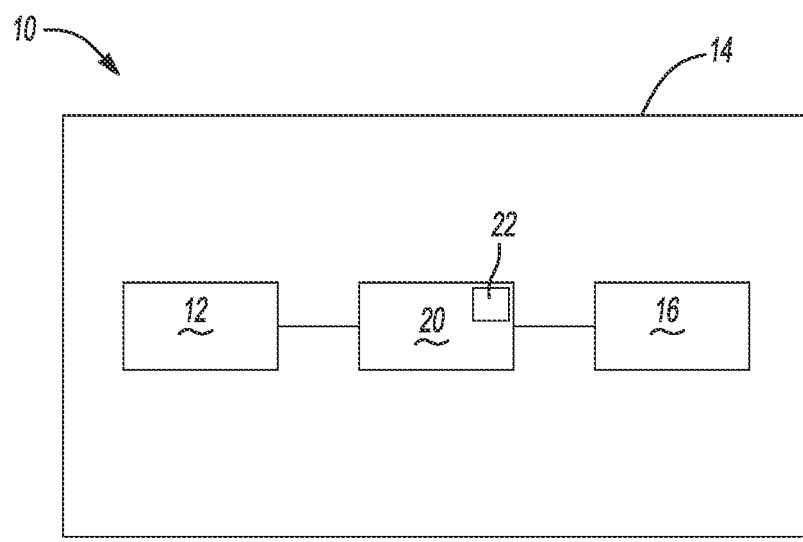
FIG. 1 is a schematic diagram of a system for estimating state of charge of a lithium battery cell of a vehicle in accordance with one example of the present disclosure.

In accordance with one example of the present disclosure, FIG. 1 depicts a system 10 for estimating state of charge of a lithium battery cell 12 of a vehicle 14. As shown, the system 10 comprises a display 16 disposed in the vehicle 14 for indicating the estimated state of charge of the lithium battery cell 12. The system 10 further comprises a control unit 20 disposed in the vehicle 14. As depicted, the control unit 20 is connected to the battery cell 12 and the display 16.

Generally, the control unit 20 may include an observer 22 that may be programmed to estimate the state of charge of a lithium battery cell of a vehicle. Such estimation is based on relationships between battery cell current, state of charge of the battery cell, and lithium surface density. The relationships may be described in linear models and non-linear functions discussed in greater detail below.

Moreover, the control unit 20 or the observer 22 of the control unit 20 estimates the state of charge by comparing actual lithium surface density and predicted lithium surface density by way of given parameters, linear models and non-linear functions discussed below. The control unit 20 or the observer 22 corrects error between the actual and predicted lithium surface densities in real time to a first predetermined percent error or first threshold which may be greater than or equal to zero. The estimated state of charge is estimated when the actual and predicted lithium surface densities are within a second threshold or second predetermined percent error. It is to be understood that either the control unit 20 or the observer 22 may be programmed as described herein without departing from the spirit or scope of the present disclosure.

Figure 2A:
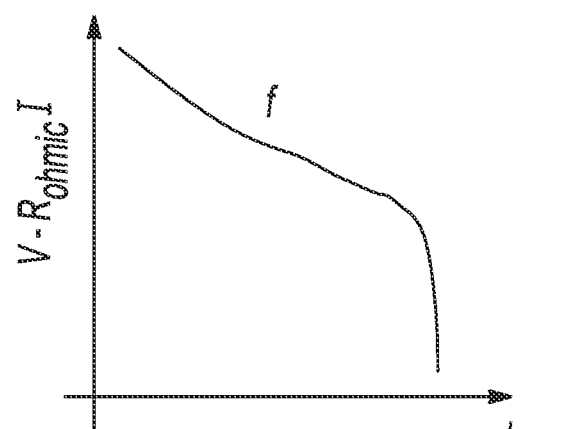
FIG. 2A is a graph of a voltage-normalized lithium surface density relationship in accordance with a non-linear function of the lithium battery cell in FIG. 1.

More specifically, the control unit 20 is programmed to include or store a non-linear function of the lithium battery cell 12, a normalized lithium surface density, and an actual voltage at a current of the lithium battery cell 12 having an internal resistance. In this example, the non-linear function may be represented as $$V - R_{ohmic}I = f\left(\dfrac{c_s^+}{c_{s,max}^+}\right),$$

where V is the actual voltage, $$\dfrac{c_s^+}{c_{s,max}^+}$$

is the normalized lithium surface density, I is the current, and $R_{ohmic}$ is the internal resistance of the battery cell 12. FIG. 2A is a graph depicting a voltage-normalized lithium surface density relationship in accordance with the non-linear function.

In this example, the control unit 20 is programmed to determine an actual lithium surface density based on the actual voltage relative to an inverse of the non-linear function represented as $$\dfrac{c_s^+}{c_{s,max}^+} = f^{-1}(V - R_{ohmic}I).$$

Figure 2B:
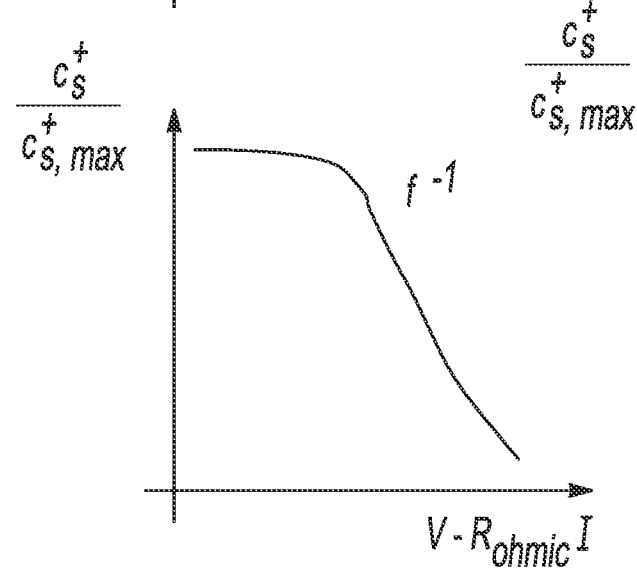
FIG. 2B is another graph of a actual lithium surface density-voltage relationship in accordance with an inverse of the non-linear function of the lithium battery cell in FIG. 1.

The control determines the actual lithium surface density by applying the actual voltage to the inverse of the non-linear function. FIG. 2B is another graph depicting an actual lithium surface density-voltage relationship in accordance with the inverse of the non-linear function.

Moreover, the control unit 20 is programmed to determine a varying parameter based on the actual lithium surface density relative to a first diffusion model. The first diffusion model may be represented as $$\frac{c_s^+(k)}{c_s^{+max}} - \frac{c_s^+(0)}{c_s^{+max}} + h\Delta t \sum_{n=1}^{k} I(n) = -I(k)b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable.

In one example, the control determines the varying parameter $b_0$ by applying the actual lithium surface density to the first diffusion model of the lithium battery cell 12. In this example, recursive least squares (RLS) approximation is employed using the first diffusion model to track the varying parameter $b_0$. Additionally, the varying parameter $b_0$ is updated in real time before the next execution to improve estimation accuracy.

Moreover, the control unit 20 is programmed to determine a predicted lithium surface density based on the varying parameter relative to a second diffusion model of the lithium battery cell 12. The second diffusion model is a diffusion dynamic model that includes relationships between current, state of charge and lithium surface density of the battery cell 12. The second diffusion model may be represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k)$$

where k is the discrete-time index, h is the known constant, $\Delta t$ is the time difference between discrete-time indices, I(k) is the measured current at k time index, $$\frac{c_s^+}{c_{s,max}^+}$$

is the normalized lithium surface density and $SoC^+$ is the estimated state of charge, and x is a state of system. For example, the control unit 20 may determine the predicted lithium surface density by applying the varying parameter $b_0$ to the second diffusion model of the lithium battery cell 12.

In this example, the control unit 20 is programmed to determine an estimated state of charge of the lithium battery cell 12 when a difference between the predicted and actual lithium surface densities is less than a first threshold which may be greater than or equal to zero. In one example, the control unit 20 determines the estimated state of charge of the lithium battery cell 12 by comparing the predicted lithium surface density with the actual lithium surface density in real time. Then, the control unit 20 corrects the predicted lithium surface density in real time if a difference between the predicted and actual lithium surface densities is equal to or greater than a second threshold.

Moreover, the control unit 20 is programmed to transmit a signal of the estimated state of charge of the lithium battery cell 12 to the display 16 in the vehicle 14. In this example, the display 16 may include a receiver (not shown) to receive the signal from the control unit 20. Additionally, the display 16 is configured to indicate the estimated state of charge based on the signal. It is to be understood that the display 16 may indicate the estimated state of charge by any suitable manner such as a LED (light emitting diode) display without departing from the spirit or scope of the present disclosure.

Figure 3:
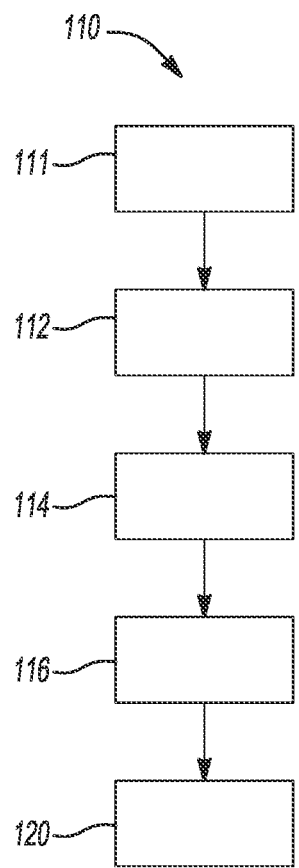
FIG. 3 is a flowchart for a method of estimating state of charge for the system in FIG. 1.

With one example of the present disclosure, FIG. 3 depicts a method 110 for estimating state of charge of a lithium battery cell 12 of a vehicle 14 in accordance with the system 10 of FIG. 1. As shown, the method 110 comprises in box 111 providing a non-linear function of the lithium battery cell 12, a normalized lithium surface density and an actual voltage at a current of the lithium battery cell 12 having an internal resistance. The non-linear function may be represented as $$V - R_{ohmic} I = f\left(\frac{c_s^+}{c_{s,max}^+}\right)$$

where V is the actual voltage, $$\frac{c_s^+}{c_{s,max}^+}$$

is the normalized lithium surface density, I is the current, $R_{ohmic}$ is the internal resistance of the battery cell. As discussed above, FIG. 2A depicts a voltage-normalized lithium surface density relationship in accordance with the non-linear function.

In this example, the method 110 further comprises in box 112 determining an actual lithium surface density based on the actual voltage relative to an inverse of the non-linear function represented as $$\frac{c_s^+}{c_{s,max}^+} = f^{-1}(V - R_{ohmic} I).$$

For example, the step of determining the actual lithium surface density comprises applying the actual voltage to the inverse of the non-linear function. FIG. 2B depicts an actual lithium surface density-voltage relationship in accordance with the inverse of the non-linear function.

In this aspect, the method 110 further comprises in box 114 determining a varying parameter based on the actual lithium surface density relative to a first diffusion model. The first diffusion model may be represented as $$\frac{c_s^+(k)}{c_s^{+max}} - \frac{c_s^+(0)}{c_s^{+max}} + h\Delta t \sum_{n=1}^{k} I(n) = -I(k)b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable.

For example, the step of determining the varying parameter may comprise applying the actual lithium surface density to the first diffusion model of the lithium battery cell 12. In this example, recursive least squares (RLS) approximation is employed using the first diffusion model to track the varying parameter $b_0$. Additionally, the varying parameter $b_0$ is updated in real time before the next execution to improve estimation accuracy.

In this aspect of the present disclosure, the method 110 further comprises in box 116 determining a predicted lithium surface density based on the varying parameter relative to a second diffusion model. The second diffusion model is a diffusion dynamic model that includes relationships between current, state of charge and lithium surface density of the battery cell 12. The second diffusion model may be represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k).$$

where k is the discrete-time index, h is the known constant, $\Delta t$ is the time difference between discrete-time indices, I(k) is the measured current at k time index, $$\frac{c_s^+}{c_{s,max}^+}$$

is the normalized lithium surface density and $SoC^+$ is the estimated state of charge, and x is a state of system. In this example, the step of determining the predicted lithium surface density comprises applying the varying parameter to the second diffusion model of the lithium battery cell 12.

In this aspect, the method 110 further comprises in box 120 determining an estimated state of charge of the lithium battery cell 12 when a difference between the predicted and actual lithium surface densities is less than a first threshold which may be greater than or equal to zero. In one example, the step of determining the estimated state of charge of the lithium battery cell 12 comprises comparing the predicted lithium surface density with the actual lithium surface density in real time. Moreover, the step of determining the estimated state of charge of the lithium battery cell 12 further comprises correcting the predicted lithium surface density in real time if a difference between the predicted and actual lithium surface densities is equal to or greater than a second threshold.

In this example, the method 110 may further comprise transmitting a signal of the estimated state of charge of the lithium battery cell 12 to the display 16. In this example, the display 16 may include a receiver (not shown) to receive the signal from the control unit 20. The method 110 further comprises displaying the estimated state of charge based on the signal. It is to be understood that the display may indicate the estimated state of charge by any suitable manner such as a LED (light emitting diode) display without departing from the spirit or scope of the present disclosure.

Figure 4:
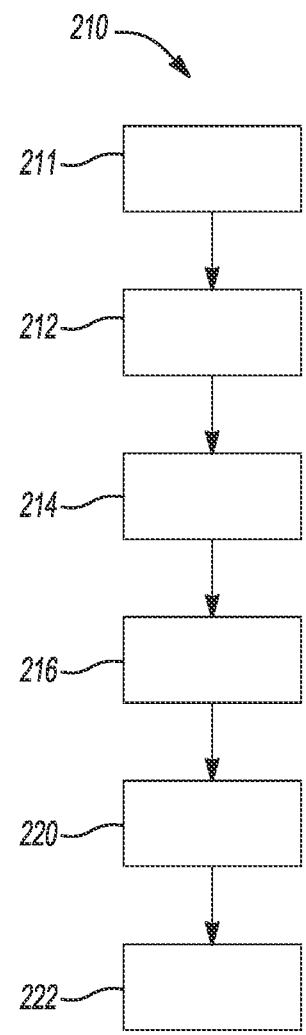
FIG. 4 is a flowchart for another method of estimating state of charge for the system in FIG. 1.

With another example of the present disclosure, FIG. 4 depicts a method 210 for estimating state of charge of a lithium battery cell 12 of a vehicle 14 in accordance with the system 10 of FIG. 1. As shown, the method 210 comprises in box 211 providing a non-linear function of the lithium battery cell 12, a normalized lithium surface density and an actual voltage at a current of the lithium battery cell 12 having an internal resistance. The non-linear function may be represented as $$V - R_{ohmic} I = f\left(\frac{c_s^+}{c_{s,max}^+}\right)$$

where V is the actual voltage, $$\frac{c_s^+}{c_{s,max}^+}$$

is the normalized lithium surface density, I is the current, $R_{ohmic}$ is the internal resistance of the battery cell. As discussed above, FIG. 2A depicts a voltage-normalized lithium surface density relationship in accordance with the non-linear function.

In this example, the method 210 further comprises in box 212 determining an actual lithium surface density based on the actual voltage relative to an inverse of the non-linear function represented as $$\frac{c_s^+}{c_{s,max}^+} = f^{-1}(V - R_{ohmic} I).$$

For example, the step of determining the actual lithium surface density comprises applying the actual voltage to the inverse of the non-linear function. FIG. 2B depicts an actual lithium surface density-voltage relationship in accordance with the inverse of the non-linear function.

In this aspect, the method 210 further comprises in box 214 determining a varying parameter based on the actual lithium surface density relative to a first diffusion model. The first diffusion model may be represented as $$\frac{c_s^+(k)}{c_s^{+max}} - \frac{c_s^+(0)}{c_s^{+max}} + h\Delta t \sum_{n=1}^{k} I(n) = -I(k) b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable.

For example, the step of determining the varying parameter comprises applying the actual lithium surface density to the first diffusion model of the lithium battery cell 12. In this example, recursive least squares (RLS) approximation is employed using the first diffusion model to track the varying parameter $b_0$. Additionally, the varying parameter $b_0$ is updated in real time before the next execution to improve estimation accuracy.

In this aspect of the present disclosure, the method 210 further comprises in box 216 determining a predicted lithium surface density based on the varying parameter relative to a second diffusion model. The second diffusion model is a diffusion dynamic model that includes relationships between current, state of charge and lithium surface density of the battery cell 12. The second diffusion model may be represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k).$$

where k is the discrete-time index, h is the known constant, $\Delta t$ is the time difference between discrete-time indices, I(k) is the measured current at k time index, $$\frac{c_s^+}{c_{s,max}^+}$$

is the normalized lithium surface density and $SoC^+$ is the estimated state of charge, and x is a state of system. In this example, the step of determining the predicted lithium surface density comprises applying the varying parameter to the second diffusion model of the lithium battery cell 12.

In this aspect, the method 210 further comprises in box 220 determining an estimated state of charge of the lithium battery cell 12 when a difference between the predicted and actual lithium surface densities is less than a first threshold, e.g., 0.5% In one example, the step of determining the estimated state of charge of the lithium battery cell 12 comprises comparing the predicted lithium surface density with the actual lithium surface density in real time. Moreover, the step of determining the estimated state of charge of the lithium battery cell 12 further comprises correcting the predicted lithium surface density in real time if a difference between the predicted and actual lithium surface densities is equal to or greater than a second threshold.

In this example, the method 210 may further comprise transmitting a signal of the estimated state of charge of the lithium battery cell 12 to the display 16. In this example, the display 16 may include a receiver (not shown) to receive the signal from the control unit 20. Moreover, the method 210 further comprises in box 222 displaying the estimated state of charge based on the signal. It is to be understood that the display 16 may indicate the estimated state of charge by any suitable manner such as a LED (light emitting diode) display without departing from the spirit or scope of the present disclosure.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A method for estimating state of charge of a lithium battery cell of a vehicle, the method comprising:
   providing a non-linear function of the lithium battery cell, a normalized lithium surface density and an actual voltage at a current of the lithium battery cell having an internal resistance, the non-linear function represented as $$V - R_{ohmic}I = f\left(\frac{c_s^+}{c_{s,max}^+}\right)$$

where V is the actual voltage, $$\frac{c_s^+}{c_{s,max}^+}$$

is the normalized lithium surface density, I is the current, $R_{ohmic}$ is the internal resistance of the battery cell;
determining an actual lithium surface density based on the actual voltage relative to an inverse of the non-linear function represented as $$\frac{c_s^+}{c_{s,max}^+} = f^{-1}(V - R_{ohmic}I);$$

determining a varying parameter based on the actual lithium surface density relative to a first diffusion model represented as $$\frac{c_s^+(k)}{c_s^{+max}} - \frac{c_s^+(0)}{c_s^{+max}} + h\Delta t \sum_{n=1}^{k} I(n) = -I(k)b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable;
determining a predicted lithium surface density based on the varying parameter relative to a second diffusion model represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k);$$

determining an estimated state of charge of the lithium battery cell when a difference between the predicted and actual lithium surface densities is less than a first threshold.

2. The method of claim 1 wherein the step of determining the estimated state of charge of the lithium battery cell comprises comparing the predicted lithium surface density with the actual lithium surface density in real time.

3. The method of claim 2 wherein the step of determining the estimated state of charge of the lithium battery cell comprises correcting the predicted lithium surface density in real time if the difference between the predicted and actual lithium surface densities is greater than a second threshold.

4. The method of claim 1 wherein the step of determining the actual lithium surface density comprises applying the actual voltage to the inverse of the non-linear function.

5. The method of claim 1 wherein the step of determining the varying parameter comprises applying the actual lithium surface density to the first diffusion model of the lithium battery cell.

6. The method of claim 1 wherein the step of determining the predicted lithium surface density comprises applying the varying parameter to the second diffusion model of the lithium battery cell.

7. The method of claim 1 further comprising:
transmitting a signal of the estimated state of charge to a receiver having a display in the vehicle; and
displaying the estimated state of charge based on the signal to monitor.

8. A method for estimating state of charge of a lithium battery cell of a vehicle, the method comprising:
providing a non-linear function of the lithium battery cell, a normalized lithium surface density and an actual voltage at a current of the lithium battery cell having an internal resistance, the non-linear function represented as $$V - R_{ohmic} I = f\left(\frac{c_s^+}{c_{s,max}^+}\right)$$

where V is the actual voltage, $$\frac{c_s^+}{c_{s,max}^+}$$

is the normalized lithium surface density, I is the current, $R_{ohmic}$ is the internal resistance of the battery cell;
determining an actual lithium surface density based on the actual voltage relative to an inverse of the non-linear function represented as $$\frac{c_s^+}{c_{s,max}^+} = f^{-1}(V - R_{ohmic} I);$$

determining a varying parameter based on the actual lithium surface density relative to a first diffusion model represented as $$\frac{c_s^+(k)}{c_s^{+max}} - \frac{c_s^+(0)}{c_s^{+max}} + h\Delta t \sum_{n=1}^{k} I(n) = -I(k) b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable;
determining a predicted lithium surface density based on the varying parameter relative to a second diffusion model represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k);$$

determining an estimated state of charge of the lithium battery cell when a difference between the predicted and actual lithium surface densities is less than a first threshold; and
displaying the estimated state of charge of the lithium battery cell in the vehicle to monitor battery cell state of charge.

9. The method of claim 8 wherein the step of determining the estimated state of charge of the lithium battery cell comprises comparing the predicted lithium surface density with the actual lithium surface density in real time.

10. The method of claim 9 wherein the step of determining the estimated state of charge of the lithium battery cell comprises correcting the predicted lithium surface density in real time if a difference between the predicted and actual lithium surface densities is greater than a second threshold.

11. The method of claim 8 wherein the step of determining the actual lithium surface density comprises applying the actual voltage to the inverse of the non-linear function.

12. The method of claim 8 wherein the step of determining the varying parameter comprises applying the actual lithium surface density to the first diffusion model of the lithium battery cell.

13. The method of claim 8 wherein the step of determining the predicted lithium surface density comprises applying the varying parameter to the second diffusion model of the lithium battery cell.

14. The method of claim 8 wherein the step of displaying comprises:
transmitting a signal of the estimated state of charge to a receiver having a display in the vehicle; and
displaying the estimated state of charge based on the signal to monitor.

15. A system for estimating state of charge of a lithium battery cell of a vehicle, the method comprising:
a display disposed in the vehicle for indicating the estimated state of charge of the lithium battery cell;
a control unit disposed in the vehicle, the control unit being connected to the battery cell and the display, the electronic control unit being programmed to provide a non-linear function of the lithium battery cell, a normalized lithium surface density and an actual voltage at a current of the lithium battery cell having an internal resistance, the non-linear function represented as $$V - R_{ohmic} I = f\left(\frac{c_s^+}{c_{s,max}^+}\right)$$

where V is the actual voltage, $$\frac{c_s^+}{c_{s,max}^+}$$

is the normalized lithium surface density, I is the current, $R_{ohmic}$ is the internal resistance of the battery cell;
wherein the control unit is programmed to determine an actual lithium surface density based on the actual voltage relative to an inverse of the non-linear function represented as $$\frac{c_s^+}{c_{s,max}^+} = f^{-1}(V - R_{ohmic} I);$$

wherein the control unit is programmed to determine a varying parameter based on the actual lithium surface density relative to a first diffusion model represented as $$\frac{c_s^+(k)}{c_s^{+max}} - \frac{c_s^+(0)}{c_s^{+max}} + h\Delta t \sum_{n=1}^{k} I(n) = -I(k)b_0$$

where $b_0$ is the varying parameter dependent on temperature and aging, k is a discrete-time index, h is a known constant, $\Delta t$ is a time difference between discrete-time indices, I(k) is a measured current at k time index, and n is a summation variable;

wherein the control unit is programmed to determine a predicted lithium surface density based on the varying parameter relative to a second diffusion model represented as $$x(k+1) = x(k) - I(k) \text{ and}$$

$$\begin{bmatrix} \frac{c_s^+(k)}{c_s^{+max}} \\ SoC^+(k) \end{bmatrix} = \begin{bmatrix} h\Delta t \\ h\Delta t \end{bmatrix} x(k) + \begin{bmatrix} -b_0 - h\Delta t \\ 0 \end{bmatrix} I(k)$$

wherein the control unit is programmed to determine an estimated state of charge of the lithium battery cell when a difference between the predicted and actual lithium surface densities is less than a first threshold;

wherein the control unit is programmed to transmit a signal of the estimated state of charge of the lithium battery cell to the display in the vehicle; and wherein the display is configured to indicate the estimated state of charge based on the signal.

16. The system of claim 15 wherein the step of determining the estimated state of charge of the lithium battery cell comprises comparing the predicted lithium surface density with the actual lithium surface density in real time.

17. The system of claim 16 wherein the step of determining the estimated state of charge of the lithium battery cell comprises correcting the predicted lithium surface density in real time if a difference between the predicted and actual lithium surface densities is greater than a second threshold.

18. The system of claim 15 wherein the step of determining the actual lithium surface density comprises applying the actual voltage to the inverse of the non-linear function.

19. The system of claim 15 wherein the step of determining the varying parameter comprises applying the actual lithium surface density to the first diffusion model of the lithium battery cell.

20. The system of claim 15 wherein the step of determining the predicted lithium surface density comprises applying the varying parameter to the second diffusion model of the lithium battery cell.

* * * * *